(12) United States Patent
Pueschner et al.

(10) Patent No.: US 10,282,655 B2
(45) Date of Patent: May 7, 2019

(54) CHIP CARD MODULE, CHIP CARD, CHIP CARD ARRANGEMENT, METHOD OF FORMING A CHIP CARD MODULE, AND METHOD OF FORMING A CHIP CARD

(71) Applicant: Infineon Technologies AG, Neubiberg (DE)

(72) Inventors: Frank Pueschner, Kelheim (DE);
Siegfried Hoffner, Nesselwang (DE);
Jens Pohl, Bernhardswald (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/650,994

(22) Filed: Jul. 17, 2017

(65) Prior Publication Data
US 2018/0032854 A1 Feb. 1, 2018

(30) Foreign Application Priority Data

Aug. 1, 2016 (DE) .................. 10 2016 114 199

(51) Int. Cl.
*G06K 19/07* (2006.01)
*G06K 19/077* (2006.01)
(Continued)

(52) U.S. Cl.
CPC ... *G06K 19/07775* (2013.01); *G06K 19/0723* (2013.01); *G06K 19/0775* (2013.01); *G06K 19/07747* (2013.01); *G06K 19/07754* (2013.01); *H01L 21/56* (2013.01); *H01L 23/49855* (2013.01); *H01L 24/13* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 2224/131* (2013.01); *H01L 2224/1601* (2013.01); *H01L 2224/16225* (2013.01); *H01L 2224/2919* (2013.01); *H01L 2224/32225* (2013.01); *H01L 2224/73204* (2013.01); *H01L 2224/73253* (2013.01); *H01L 2924/15321* (2013.01)

(58) Field of Classification Search
CPC ......... G06K 19/0723; G06K 19/07747; G06K 19/0775
USPC .......................................................... 235/492
See application file for complete search history.

(56) References Cited

U.S. PATENT DOCUMENTS 9,652,705 B1 * 5/2017 Lindblad .............. G06K 19/067
2003/0085454 A1 * 5/2003 Reutner ........... G06K 19/07749
257/679

(Continued)

*Primary Examiner* — Toan C Ly
(74) *Attorney, Agent, or Firm* — Viering, Jentschura & Partner MBB

(57) ABSTRACT

A chip card module is provided. The chip card module may include a carrier having a first side and an opposite second side, a chip arranged over the carrier, the chip having a first chip contact, a first and a second antenna contact formed over the first side, a metal-free area formed over the first side between the first antenna contact and the second antenna contact, wherein the metal-free area extends between a first edge portion and a second edge portion of the carrier, and a first chip connection electrically connecting the first chip contact to the first antenna contact, wherein the first chip connection is at least partially arranged over the second side in a region opposite the metal-free area.

19 Claims, 10 Drawing Sheets

(51) Int. Cl.
*H01L 23/498* (2006.01)
*H01L 21/56* (2006.01)
*H01L 23/00* (2006.01)

(56) References Cited

U.S. PATENT DOCUMENTS

2011/0023289 A1* 2/2011 Finn .................. G06K 19/07722
  29/601
2015/0278675 A1* 10/2015 Finn .................. G06K 19/07783
  235/492

* cited by examiner

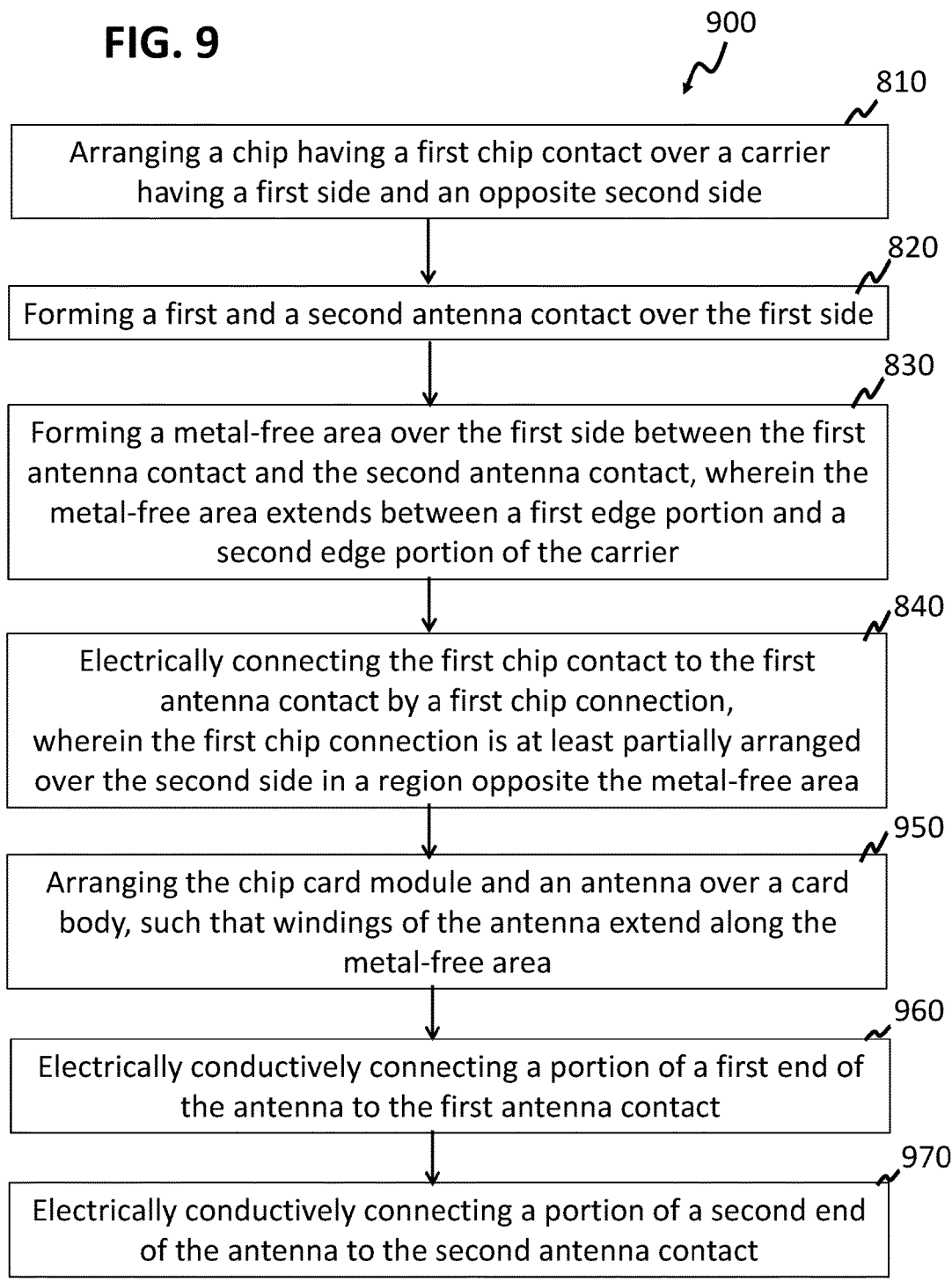

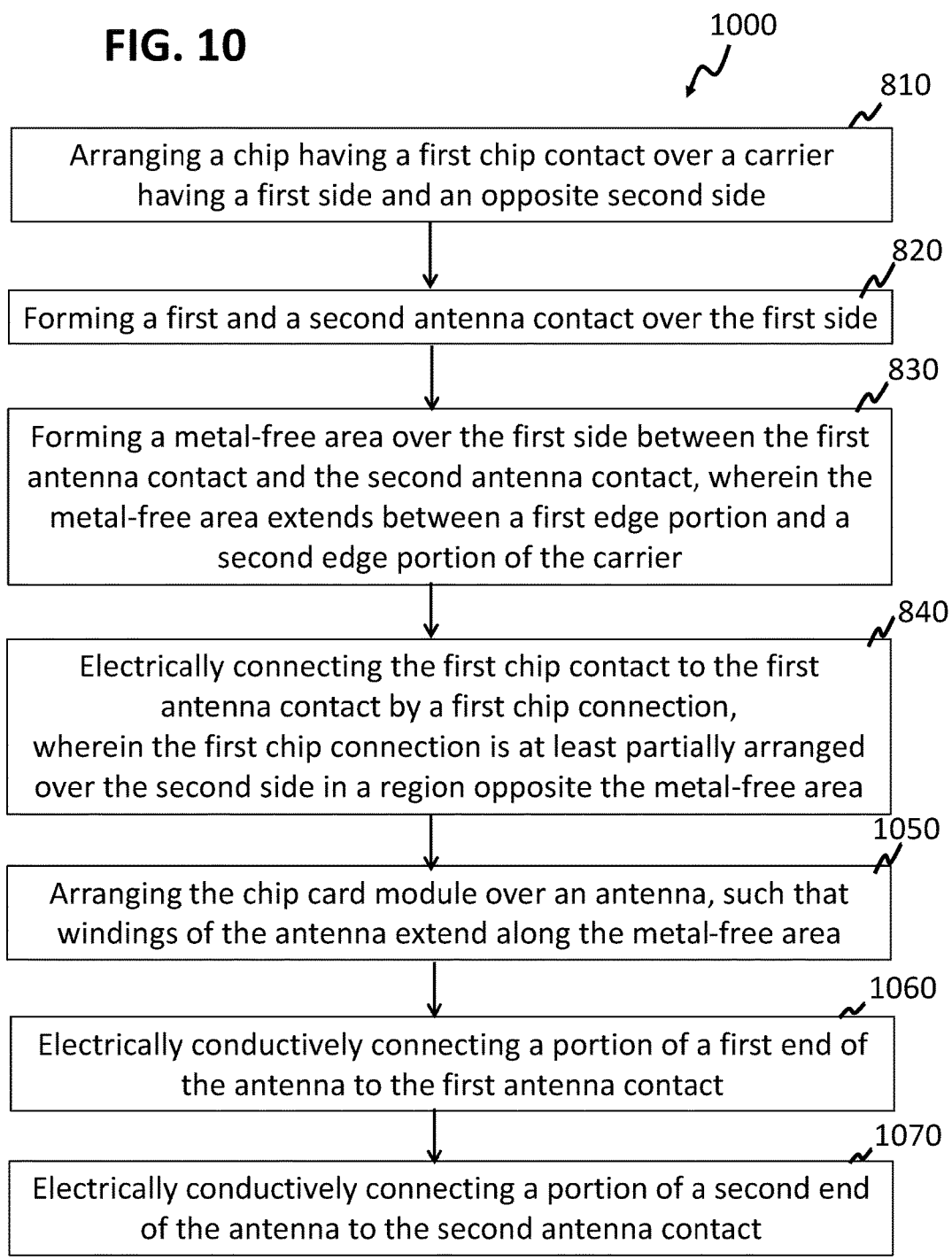

CHIP CARD MODULE, CHIP CARD, CHIP CARD ARRANGEMENT, METHOD OF FORMING A CHIP CARD MODULE, AND METHOD OF FORMING A CHIP CARD

CROSS-REFERENCE TO RELATED APPLICATION

This application claims priority to German Patent Application Serial No. 10 2016 114 199.2, which was filed Aug. 1, 2016, and is incorporated herein by reference in its entirety.

TECHNICAL FIELD

Various embodiments relate generally to a chip card module, a chip card, a chip card arrangement, a method of forming a chip card module, and a method of forming a chip card.

BACKGROUND

A typical state-of-the-art contactless chip card (also referred to as smartcard) with a mold module 102a (also referred to as chip card module or, for short, module) and an antenna wire 104 is shown in FIG. 1A. The two ends 104_1, 104_2 of the antenna wire 104 are physically attached to the chip card module 102a. This construction has good electrical properties, due to the physical connection of the antenna wires 104 with the module 102a, a low interrogation field strength Hmin and a very high bit rate (VHBR) may be possible.

A disadvantage of the configuration of the smartcard of FIG. 1A may be a limited reliability of the mold module during use, e.g. in the field. In such cards, for example cracks of the mold body or chip cracks caused by overstress (e.g. mishandling by the user) may occur.

In terms of card manufacturing, configuration of the smartcard of FIG. 1A requires a wire crossing (shown in region 104B) to enable a connection of both antenna wire ends 104_1, 104_2 to the module 102a. For this wire crossing, an insulated antenna wire 104 may be required to avoid a short-circuit. The insulated antenna wire 104 may limit a process for forming a wire-module interconnect to welding (a process that is not very reliable, much rework may be required) or to soldering with very high temperatures to remove the insulation by heat. Both processes are disadvantageous for the card structure, they can cause burns in the card material (typically PVC, PC or PET).

A state-of-the-art contactless smartcard with a chip card module 102b having an integrated module antenna 108 for data transmission by inductively coupling to the antenna 104 (a so-called coil-on-module contactless module, COM-CL module) and an antenna wire 104 (also referred to as booster antenna) is shown in FIG. 1B.

The inductive coupling may limit the electrical properties of the smartcard system, so that it may be difficult to find configurations that fulfill the required specifications in terms of low Hmin, VHBR and ISO14443 standard.

The contactless smartcard of FIG. 1B may also require a wire crossing, and hence insulated wire.

The COM-CL smartcard may show good reliability properties. Predicted failure rates for smartcards that are in use (also referred to as field reject rates) may be about 10× smaller than the reject rates of smartcards with mold modules. The good reliability may at least partially originate in the module construction, using a very thin (flexible) semiconductor chip, which may be capable to withstand the mechanical stress in the field.

SUMMARY

A chip card module is provided. The chip card module may include a carrier having a first side and an opposite second side, a chip arranged over the carrier, the chip having a first chip contact, a first and a second antenna contact formed over the first side, a metal-free area formed over the first side between the first antenna contact and the second antenna contact, wherein the metal-free area extends between a first edge portion and a second edge portion of the carrier, and a first chip connection electrically connecting the first chip contact to the first antenna contact, wherein the first chip connection is at least partially arranged over the second side in a region opposite the metal-free area.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 9 shows a process flow of a method of forming a chip card according to various embodiments; and FIG. 10 shows a process flow of a method of forming a chip card module arrangement according to various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In various embodiments, a chip card module is provided that may allow to provide a smartcard that combines the advantages of the two known types of chip card modules described above. For example, the chip card module in accordance with various embodiments may have a good reliability like the COM-CL smartcard of FIG. 1B, and may allow for a low interrogation field strength Hmin and a very high bit rate like the smartcard of FIG. 1A, which has the antenna physically attached to the chip card module.

In various embodiments, a requirement for a wire crossing may be eliminated by a special chip card module design.

In various embodiments, a metal free area may be provided in the chip card module for a routing of the antenna coil across the module. Thereby, a utilization of non-insulated wire, which enables the utilization of a low-temperature soft solder process, may be made possible.

In various embodiments, the reliable package structure of the COM-CL type chip card module is applied to a wire-connected module.

Figure 2A:
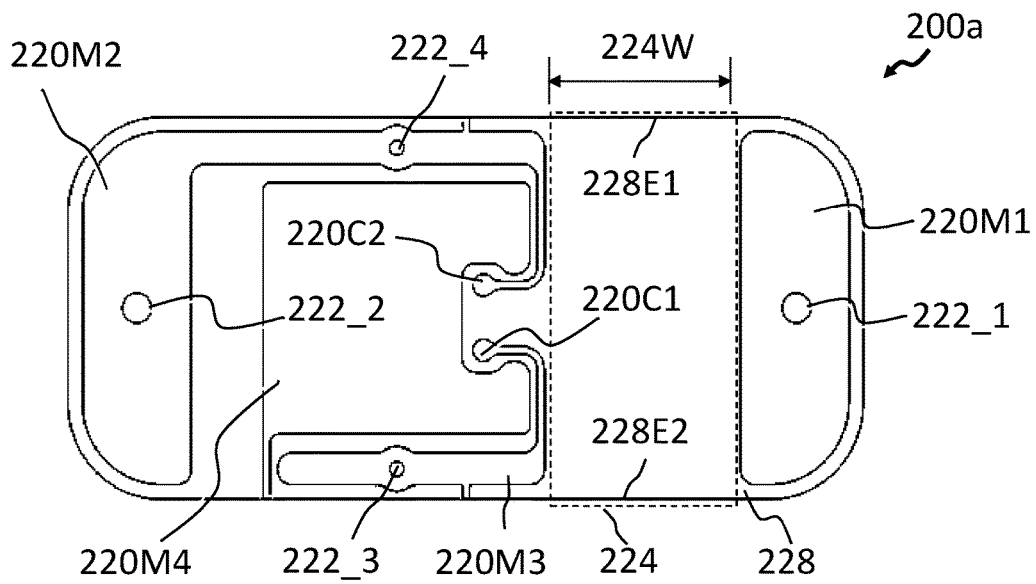
FIGS. 2A and 2B show schematic views of connection structures over a first and a second side, respectively, of a chip card module according to various embodiments.
Figure 2B:
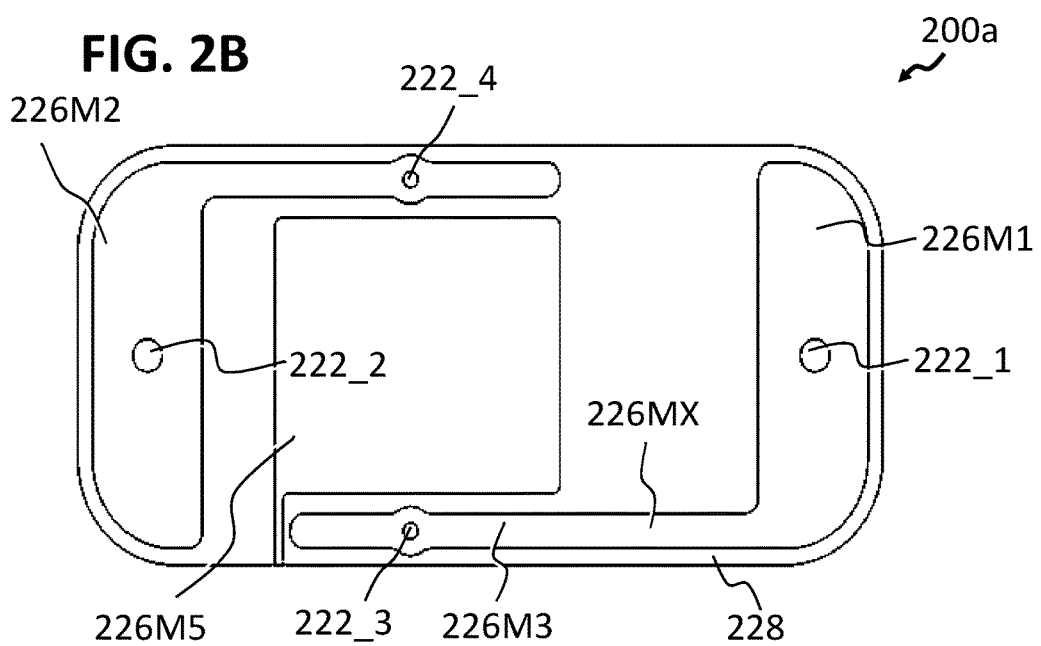

FIGS. 2A and 2B show schematic views of connection structures over a first and a second side, respectively, of a chip card module 200a according to various embodiments. A relative arrangement of structures in FIG. 2A and FIG. 2B may be considered as looking at the chip card module 200a from the top to show, in FIG. 2A, the structures arranged over the top side, and as looking at the structures arranged over the bottom side of the chip card module 200a after a removal of the top side structures and a chip card module body. Alternatively, the relative arrangement of the structures in FIG. 2A and FIG. 2B may be considered as one of them showing a mirrored view. This presentation may allow an easier identification of matching through-hole connections.

Figure 3A:
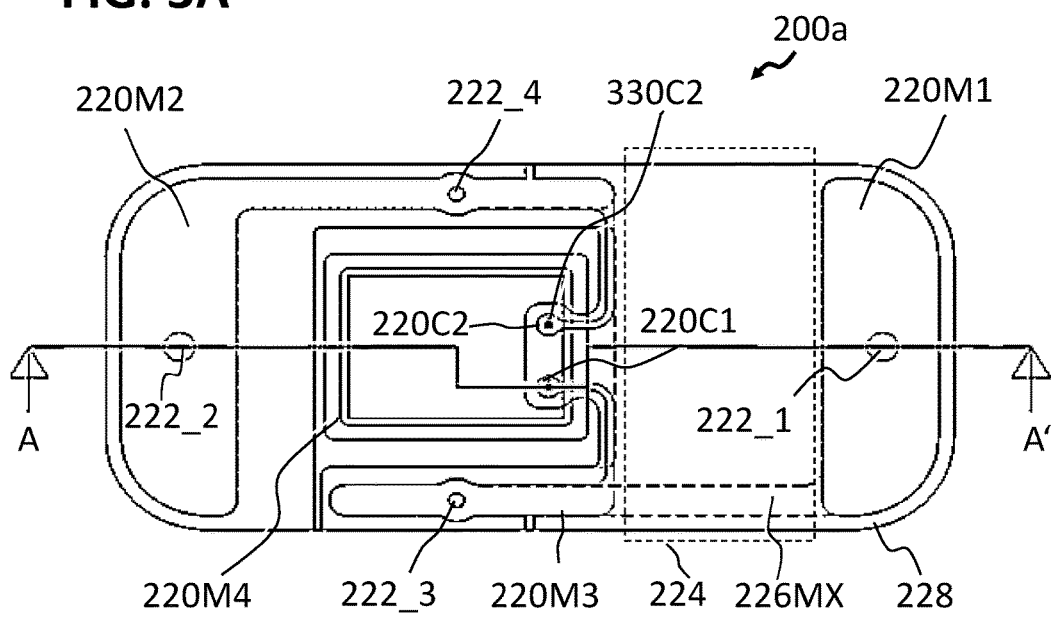
FIG. 3A shows a schematic top view of a chip card module according to various embodiments.
Figure 3B:
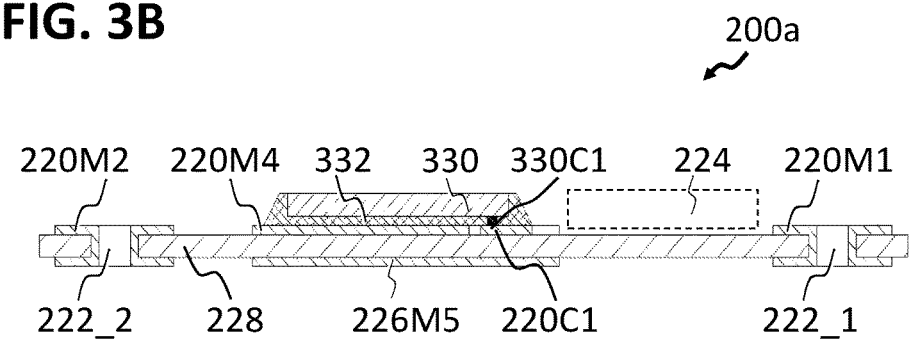
FIG. 3B shows a cross section along the line A-A' of FIG. 3A.

FIG. 3A shows a schematic view of the a chip card module 200a according to various embodiments, and FIG. 3B shows a cross section of the chip card module 200a along the line A-A' of FIG. 3A.

In various embodiments, the chip card module 200a may include a carrier 228 having a first side and an opposite second side. The carrier 228 may include or consist of any typically used material, for example a plastic material, e.g. a tape substrate, e.g. a polymer base layer (e.g. polyimide, PET, epoxy laminate) and may be formed in a typical way. The material of the carrier 228 may for example be at least moderately flexible. Alternatively, the carrier material may be rigid. In a case of the carrier 228 including or consisting of the tape substrate, what is shown in FIG. 2A may also be referred to as a bare tape substrate of the chip card module.

An important feature is the Metal free area on one side of the tape substrate, this will be used to enable an antenna wire design without wire crossing.

FIG. 4 shows the corresponding back side of the tape substrate.

FIG. 3: Invention module (Chip side), bare tape substrate

In various embodiments, the chip card module 200a may include a chip 330, e.g. a semiconductor chip, arranged over the carrier 228, the chip 330 having a first chip contact 330C1. The chip 330 may further have a second chip contact 330C2.

In various embodiments, the chip 330 may be arranged over the first side of the carrier 228.

In various embodiments, the chip card module 200a may include a first antenna contact 220M1, 222_1 and a second antenna contact 220M2, 222_2. Both antenna contacts 220M1, 222_1, 220M2, 222_2 may be formed over the first side. The first antenna contact 220M1, 222_1 and the second antenna contact 220M2, 222_2 may be electrically conductive. The antenna contacts 220M1, 222_1, 220M2, 222_2 may for example include or consist of a metal, for example copper (Cu) or a copper alloy. A surface of the antenna contacts 220M1, 222_1, 220M2, 222_2 may be coated with a coating that may enable or facilitate soldering, e.g. soldering of an antenna to the antenna contacts. The coating may for example include or consist of silver (Ag), nickel-gold (NiAu), nickel-palladium (NiPd), or the like.

The first antenna contact 220M2, 222_1 and the second antenna contact 220M2, 222_1 may be configured to have the antenna, e.g. a booster antenna of the chip card, physically electrically connected thereto. The antenna is not shown in FIG. 2A to FIG. 3B, but see FIG. 4A to FIG. 7.

In various embodiments, the first and the second antenna contacts 220M1, 222_1, 220M2, 222_2 may be formed as and/or may include a structured metal layer 220M1, 220M2, for example by known processes like plating and/or deposition. A thickness of the first and the second antenna contacts 220M1, 222_1, 220M2, 222_2 may in various embodiments be in a range from about 1 μm to about 50 μm, e.g. from about 5 μm to about 20 μm, e.g. around 10 μm.

In various embodiments, the first and the second antenna contacts 220M1, 222_1, 220M2, 222_2 may include through holes 222_1, 222_2, e.g. a first through hole 222_1 of the first antenna contact 220M1, 222_1 and a second through hole 222_2 of the second antenna contact 220M2, 222_2. The through holes 222_1, 222_2 may be plated through holes. For example, the through holes 222_1, 222_2 may be plated with the same material, e.g. combination of materials, as the metal layers 220M1, 220M2. In various embodiments, there may be two different types of plated throughholes. Smaller holes (222_3, 222_4, see below) for making contact to the metal on the substrate back side, and larger holes (222_1, 222_2) that may additionally be used for a solder process inspection.

In various embodiments, the through holes 222_1, 222_2 may be formed sufficiently large to allow, after electrically connecting the antenna to the antenna contacts 220M1, 222_1, 220M2, 222_2, an inspection of the solder contact through the through holes 222_1, 222_2, for example for inspecting the quality of the solder joint, i.e. the solder flow. The through holes may for example have a width in a range from about 20 μm to about 150 μm, for example around 100 μm.

In various embodiments, the chip card module 200a may include a metal-free area 224 formed over the first side between the first antenna contact 220M1, 222_1 and the second antenna contact 220M2, 222_2.

The metal-free area 224 may, in various embodiments, extend between a first edge portion 228E1 and a second edge portion 228E2 of the carrier 228. The metal-free area 224 may be configured to allow for the antenna 204 to be routed therethrough (see FIG. 4A to FIG. 7), leading to an arrangement having the first antenna contact 220M1, 222_1 on one side of the antenna 204, and having the second antenna contact 220M1, 222_1 on a second side of the antenna 204 opposite the first side. The antenna 204 may include or consist of an antenna coil, which may have a plurality of windings, e.g. three or more windings, e.g. four, five, six or more windings.

The metal-free area 224 may, in various embodiments, have a dielectric surface. The surface of the metal-free area 224 may not be electrically conductive, such that no electrically conductive connection is provided by the metal-free area 224 between individual windings of the antenna 204 positioned on the surface of the metal-free area 224.

A width 224W of the metal-free area 224 may in various embodiments be sufficiently large to allow for the routing of the antenna coil through the metal-free area 224. The width 224W may in various embodiments be larger than about (3×antenna wire diameter+2×separation between antenna windings, 0.5 antenna wire diameters+2×edge separation between the outermost antenna windings and adjacent structures, ≈0.5 antenna wire diameters). For an antenna wire diameter of about 100 μm, the width 224 W may thus be at least about 550 μm. More generally, the width 224W of the metal-free area may be in a range from about 300 μm to about 5 mm, e.g. from about 550 μm to about 2 mm, e.g. around 1 mm or more.

In various embodiments, a structure of the metal-free area 224 may be such that a portion 204F (see, e.g., FIG. 4B or FIG. 4C) of the antenna 204 can be arranged in the metal-free area 224 such that the portion 204F of the plurality of windings of the antenna 204 extends from the first edge portion 228E1 to the second edge portion 228E2, thereby having the portion 204F arranged between the first antenna contact 220M1, 222_1 and the second antenna contact 220M2, 222_2. This may allow a first end 204_1 and a second end 204_2, which, in an essentially planar configuration of the antenna 204, may be located on opposite sides of the coiled portion (i.e. one end inside the coil, one outside), to be connected to the first antenna contact 220M1, 222_1 and the second antenna contact 220M2, 222_2, respectively, without a requirement of an antenna crossing.

In various embodiments, the metal-free area 224 may be an essentially rectangular area. In various embodiments, the metal-free area 224 may have any other shape that allows for the described routing of the portion 204F of the plurality of antenna windings.

In various embodiments, the chip 330 may be arranged over the same side of the carrier 228 as the metal-free area 224. This may allow to provide a chip card 400a (see, e.g., FIG. 4A and FIG. 5) including the chip card module 200a with a small thickness, because the (relatively thick) chip card module 200a and the (also relatively thick) antenna 204 may be arranged in the same layer. Alternatively, the chip 330 may be arranged over the side of the carrier 228 that is opposite the metal-free area 224.

The chip 330 may for example be arranged in a chip contact area 220M4, also referred to as a die pad. The chip contact area 220M4 may include or consist of a metal, for example a structured metal layer. The chip contact area 220M4 may in various embodiments include or consist of similar or the same metals as the antenna contacts 220M1, 222_1, 220M2, 222_1, e.g. a copper or a copper alloy, possibly with a coating for improving a soldering performance.

In various embodiments, the chip card module 200a may include a first chip connection 220M1, 222_1, 226M1, 226MX, 226M3, 222_3, 220M3, 220C1 electrically connecting the first chip contact 330C1 to the first antenna contact 220M1, 222_1, wherein the first chip connection 220M1, 222_1, 226M1, 226MX, 226M3, 222_3, 220M3, 220C1 may be at least partially (e.g., with a portion designated as 226MX) arranged over the second side in a region opposite the metal-free area 224. Thereby, the chip card module 200a may in various embodiments be configured to provide an electrically conductive bridge across the portion of the antenna coil 204F that may be arranged in the metal-free area 224.

Figure 1A:
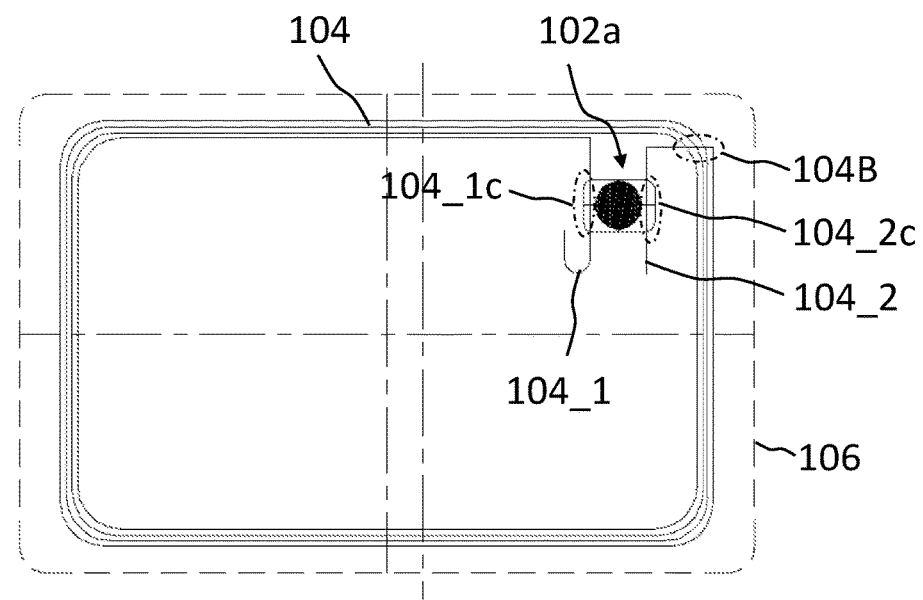
FIGS. 1A and 1B each show a schematic drawing of a contactless chip card.
Figure 1B:
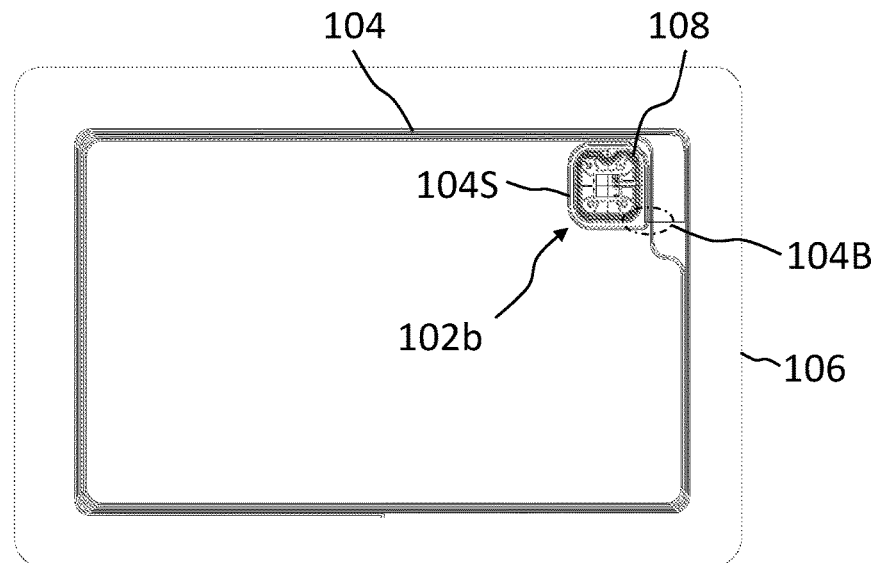

In other words, the chip card module 200a may be understood as providing the electrically conductive connection between a first end 204_1 of the antenna 204, which may for example (see, e.g., FIGS. 4A, 4B and 4C) be located outside the coil of the antenna 204, and the first schip contact 330C1, which may be located inside the coil of the antenna 204, which in known chip cards, like e.g. shown in FIG. 1A and FIG. 1B, may be provided by a wire crossing of an insulated wire 104.

In brief, in various embodiments, the continuous windings of the antenna coil 204 may be routed through the metal free area, therefore no insulation on the antenna wire 204 may be required.

In various embodiments, the chip card module 200a may include a second chip connection 220M2, 222_2, 226M2, 220C2 electrically connecting the second chip contact 330C2 to the second antenna contact 220M1, 222_1.

The second chip connection 220M2, 222_2, 226M2, 220C2 may include a fourth plated throughhole 222_4 for making contact to the metal 226_M2 on the carrier (e.g. substrate) back side.

In the embodiments shown in FIG. 3A and FIG. 3B, the chip 330 may be assembled on the diepad 220M4 in FCOS (from "flip chip on substrate") flip chip technology. The first chip contact 330C1 and the second chip contact 330C2 may be formed by metal bumps, which are shown through the chip 330 for clarity.

In various embodiments, the first chip contact 330C1 and the second chip contact 330C2 may be in physical contact with land pad areas 220C1, 220C2, respectively, of the first chip connection 220M1, 222_1, 226M1, 226MX, 226M3, 222_3, 220M3, 220C1 and of the second chip connection 220M2, 222_2, 226M2, 220C2.

In various embodiments, an adhesive 332, e.g. a glue, e.g. an electrically conductive glue may hold the chip 330 in place on the die pad 220M4 and may ensure good contact of the chip contacts 330C1, 330C2, e.g. bumps, to the metal areas 220C1, 220C2 of the carrier 228, e.g. the substrate.

Figure 4A:
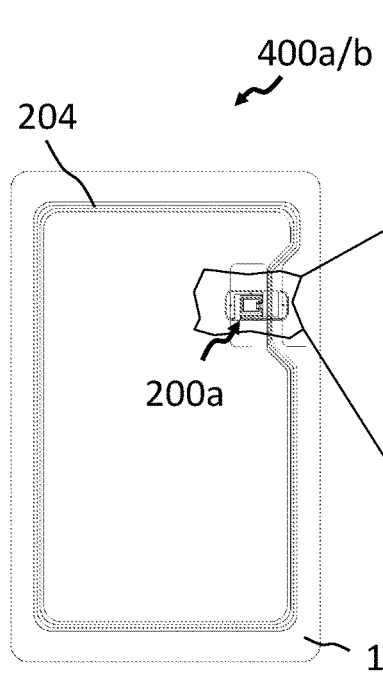
FIG. 4A shows a schematic top view of a chip card with a chip card module according to various embodiments.
Figure 4B:
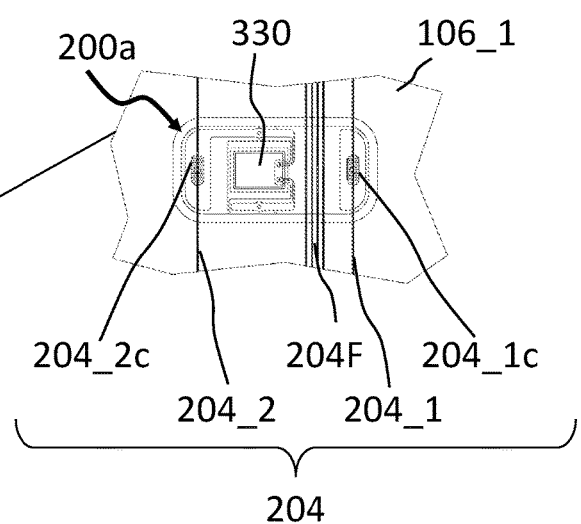
FIG. 4B and FIG. 4C each show a zoomed-in view of a possible arrangement of the chip card module of FIG. 4A.
Figure 4C:
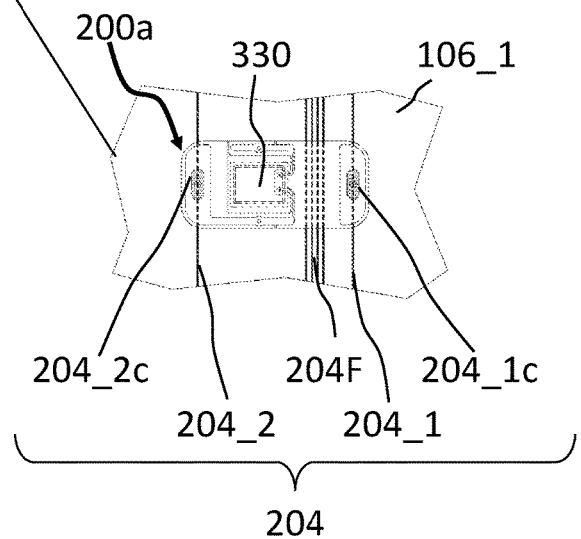
Figure 5:
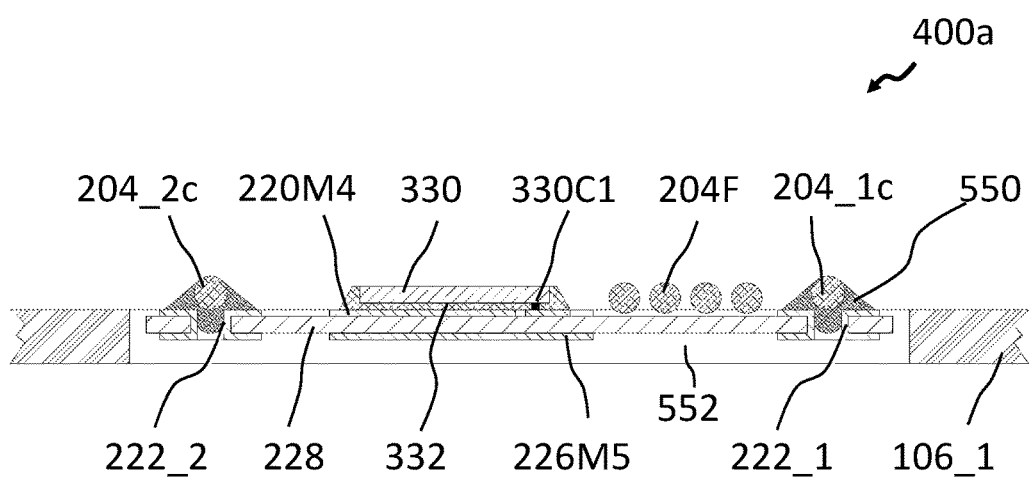
FIG. 5 shows a cross-sectional view of the chip card of FIG. 4A.
Figure 6A:
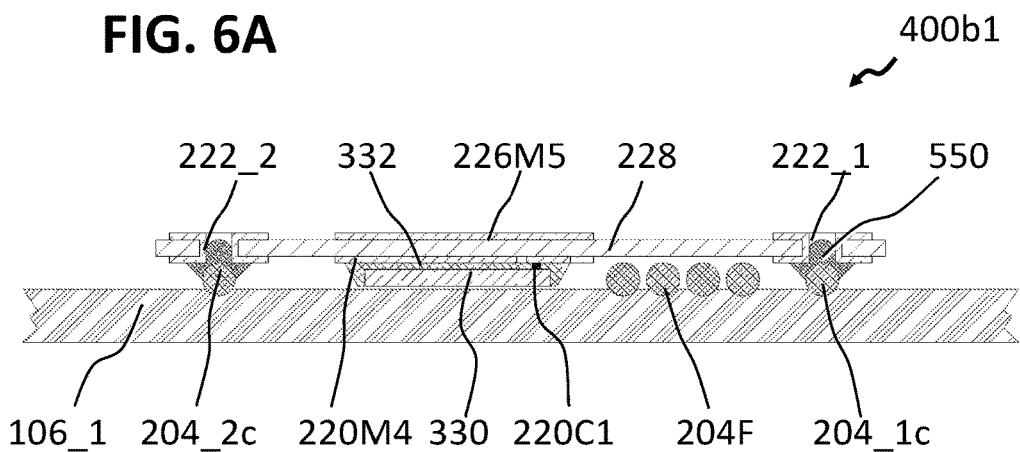
FIG. 6A shows a schematic cross sectional view of a chip card according to various embodiments.
Figure 6B:
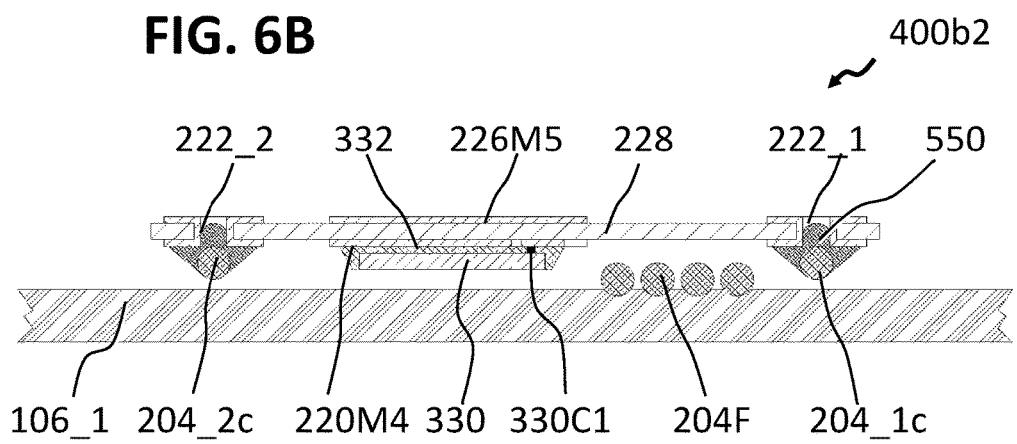
FIG. 6B shows a schematic cross sectional view of a chip card according to various embodiments.
Figure 6C:
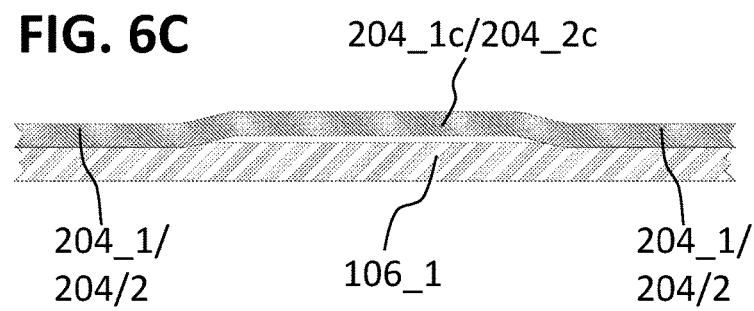
FIG. 6C shows a cross section of a portion of a wire antenna of FIG. 6B.

FIG. 4A shows a schematic top view of a chip card 400a or a chip card 400b with a chip card module 200a according to various embodiments, FIG. 4B and FIG. 4C each show a zoomed-in view of a possible arrangement of the chip card module of FIG. 4A. FIG. 5 shows a cross-sectional view of the chip card 400a of FIG. 4A. FIG. 6A and FIG. 6B each show a schematic cross sectional view of the chip card 400b (FIG. 6A in a first variation designated as 400b1, and FIG. 6B in a second variation designated as 400b2) according to various embodiments. FIG. 6C shows a cross section of a portion of the wire antenna 104 of FIG. 6B, and FIG. 7 visualizes card assembly process for forming the chip card 400a according to various embodiments.

For clarity, only one layer 106_1 of a plurality of layers 106_1, 106_2a, 106_2b, 106_3a, 106_3b of the card body 106 (see FIG. 7) is shown in FIG. 4A to FIG. 6C.

The chip card 400a and the chip card 400b may represent embodiments with a variation regarding a relative arrangement of the layer 106_1 of the card body 106, e.g. a polymer sheet, with respect to the antenna 204 and to the chip card module 200*a*. The two different variations are shown as FIG. 4B or FIG. 4C, respectively.

In the first embodiment, the chip card module 200*a* may be placed in a cavity 552 of the layer 106_1, e.g. the polymer sheet, for example with the chip 330 facing toward an outside of the cavity 552, for example projecting from the cavity 552 (e.g. as shown in FIG. 5), and the antenna 204, e.g. a first contact portion 204_1*c*, e.g. of the first end 204_1 of the antenna 204 and a second contact portion 204_2*c*, e.g. of the second end 204_2, may be soft soldered to the first antenna contact 222_1, 220M1 and to the second antenna contact 222_2, 220M2, respectively.

In various embodiments, the antenna wire may include or (e.g. essentially) consist of pure copper or a copper alloy (CuNi, CuSn, CuZn or similar) without an organic insulation layer. This may enable a good soft solder process at relatively low temperatures.

In various embodiments, the contact surfaces of the chip card module 200*a*, e.g. the first and the second land pad areas 220C1, 220C2 and/or the chip contact pad 220M4, may have a contact surface including or consisting of a solderable material, e.g. ENEPIG, Ag, Sn or similar.

In the second embodiment, the chip card module 200*a* may be flipped over, e.g. as shown in FIG. 6A and FIG. 6B, with the chip 330 facing the layer 106_1, and the antenna, e.g. the first contact portion 204_1*c* and the second contact portion 204_2*c*, may be soft soldered to the first antenna contact 222_1, 220M1 and to the second antenna contact 222_2, 220M2, respectively.

FIG. 6A and the combination of FIG. 6B/FIG. 6C show two embodiments representing a variation in the way in which the antenna 204, in particular the contact portions 204_1*c* and 204_2*c*, are arranged for the contacting by the antenna contacts 222_1, 222_2 of the chip card module 400*b*2.

In the first embodiment shown in FIG. 6A, the antenna wire 204 of the contact regions 204_1*c*, 204_2*c*, also referred to as solder area, may be partially embedded in the layer 106_1, e.g. the polymer sheet 106_1. Thereby, the flow of the solder material (i.e. the solder wetting) around the antenna wire 204 may be limited by the, e.g. polymer, material of the layer 106_1.

In the first embodiment shown in FIG. 6A, the antenna wire 204 of the contact regions 204_1*c*, 204_2*c*, may be arranged separated from the layer 106_1, e.g. the polymer sheet. This may be achieved by arranging the antenna wire 204 with a wire jump. For example, during a wire embedding, an ultrasonic embedding sonotrode may be lifted at this position to leave the wire 204 hovering above the layer 106_1 surface, e.g. polymer surface. This variant may allow for a better solder wetting and hence for an improved interconnect reliability.

In various embodiments, for the solder process, the required temperature may be applied by solder tools, hot air, laser or similar.

In various embodiments, the solder material and flux may be preapplied, e.g. by screenprinting, jetter, or similar processes/devices. Alternatively, the solder material may be applied e.g. as solder wire, during the soldering process. In various embodiments, the solder wire could also be supplied from the bottom side (the second side opposite the first side having the chip 330 arranged thereover) of the module 200*a* through the plated throughhole 222_1 and/or 222_2, respectively.

Figure 7:
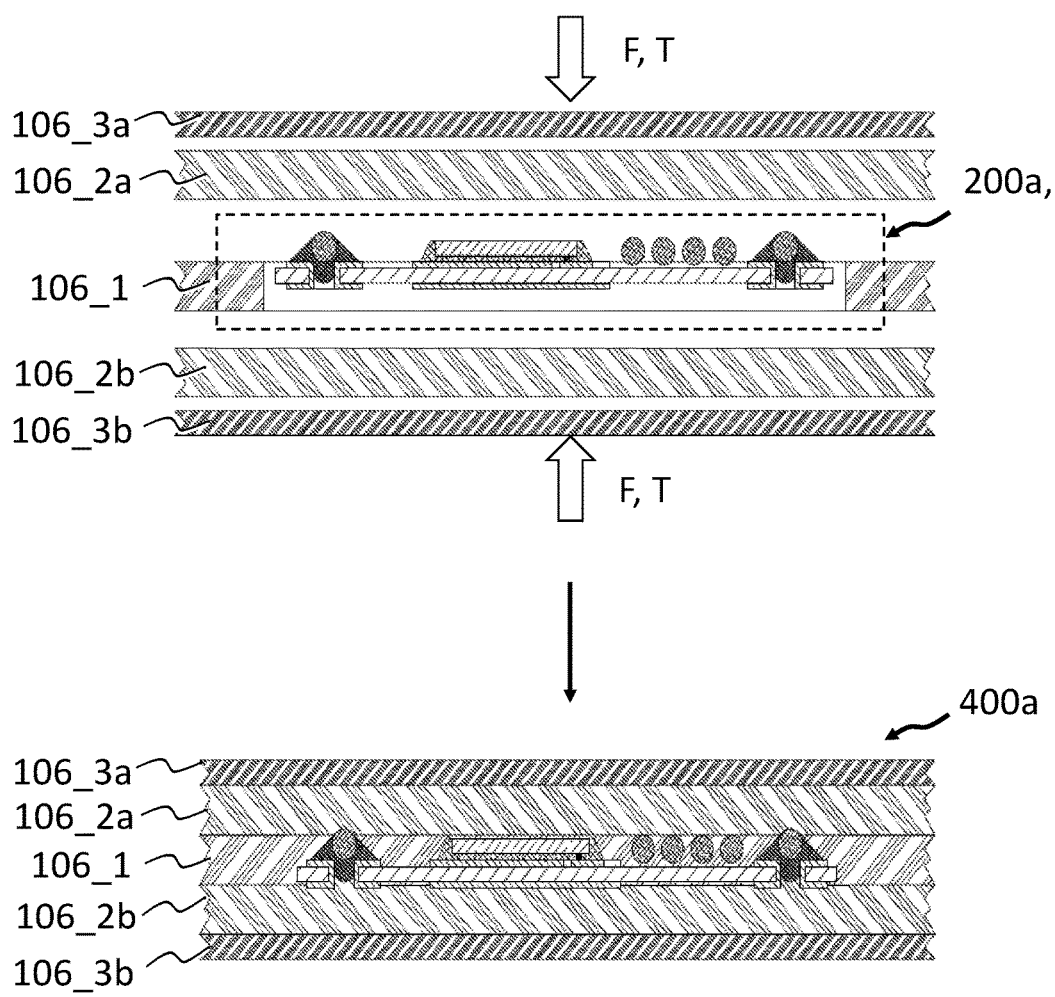
FIG. 7 visualizes a card assembly process for forming a chip card according to various embodiments.

In the card assembly process for forming the chip card 400*a* according to various embodiments visualized in FIG. 7, a laminating process may be performed after completion of the wire embedding and the module-to-antenna joining by the solder process(es). The polymer sheet 106_1 with the antenna 204 and the chip card module 200*a* arranged thereon may be stacked with additional layers 106_2*a*, 106_3*a*, e.g. polymer sheets, on one side of the layer 106_1, and additional layers 106_2*a*, 106_3*a* on an opposite side of the layer 106_1. In various embodiments, the additional layers 106_2*a*, 106_2*b* may be arranged closer, e.g. in contact with, the layer 106_1, and the additional layers 106_3*a*, 106_3*b* may be arranged over the additional layers 106_2*a*, 106_2*b*, respectively.

In various embodiments, the additional layers 106_2*a*, 106_3*a*, 106_2*a*, 106_2*b* may be or include layers as commonly used in the art. More or fewer additional layers may be arranged as required. The additional layers may for example include a protective layer for protecting the chip card from mechanical damage, moisture etc., an adhesive layer for enabling or improving an adhesion between the layers, a printing layer for providing information/decoration on the chip card 400*a*, etc.

In various embodiments, the sheet stack may be laminated in a hot press with temperature and pressure, as indicated in FIG. 7 by the arrows labeled with "F, T". Pressure and/or temperature may in various embodiments be applied from one side only. By the laminating process, a solid card structure with a thickness of typically about 800 μm, e.g. between 500 μm and 1.5 mm, may be formed.

Figure 8:
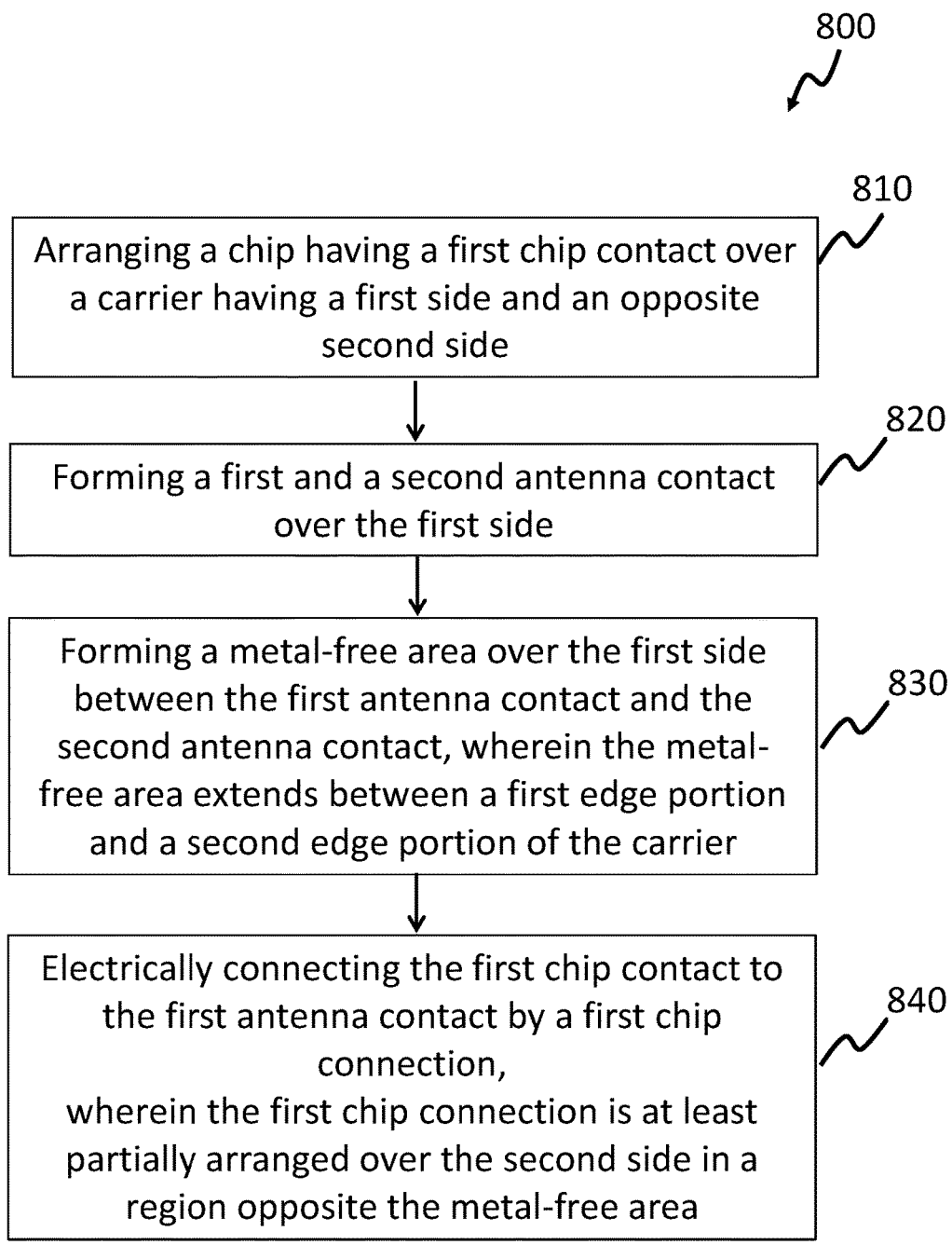
FIG. 8 shows a process flow of a method of forming a chip card module according to various embodiments.

FIG. 8 shows a process flow 800 of a method of forming a chip card module according to various embodiments.

In various embodiments, the method of forming a chip card module may include arranging a chip having a first chip contact over a carrier having a first side and an opposite second side (in 810), forming a first and a second antenna contact over the first side (in 820), forming a metal-free area over the first side between the first antenna contact and the second antenna contact, wherein the metal-free area may extend between a first edge portion and a second edge portion of the carrier (in 830), and electrically connecting the first chip contact to the first antenna contact by a first chip connection, wherein the first chip connection may be at least partially arranged over the second side in a region opposite the metal-free area (in 840).

FIG. 9 shows a process flow 900 of a method of forming a chip card according to various embodiments.

In various embodiments, the method of forming a chip card may include arranging a chip having a first chip contact over a carrier having a first side and an opposite second side (in 810), forming a first and a second antenna contact over the first side (in 820), forming a metal-free area over the first side between the first antenna contact and the second antenna contact, wherein the metal-free area may extend between a first edge portion and a second edge portion of the carrier (in 830), and electrically connecting the first chip contact to the first antenna contact by a first chip connection, wherein the first chip connection may be at least partially arranged over the second side in a region opposite the metal-free area (in 840), arranging the chip card module and an antenna over a card body, such that windings of the antenna may extend along the metal-free area (in 950), electrically conductively connecting a portion of a first end of the antenna to the first antenna contact (in 960), and electrically conductively connecting a portion of a second end of the antenna to the second antenna contact (in 970).

In various embodiments, the arranging the antenna over the card body may include partially embedding the antenna in a layer of the card body while arranging the portion of the first end of the antenna and/or the portion of the second end of the antenna on a surface of the layer, for example by arranging the antenna wire with a wire jump as described above.

In various embodiments, the electrically conductively connecting the portion of the first end of the antenna to the first antenna contact and the electrically conductively connecting the portion of the second end of the antenna to the second antenna contact may include soldering, for example soft soldering. In various embodiments, the soft soldering using relatively low temperatures may be applied, because the antenna wire 204 may not be necessary to cover the antenna by an insulating film for avoiding a short contact.

FIG. 10 shows a process flow 1000 of a method of forming a chip card module arrangement according to various embodiments.

In various embodiments, the method of forming a chip card arrangement may include arranging a chip having a first chip contact over a carrier having a first side and an opposite second side (in 810), forming a first and a second antenna contact over the first side (in 820), forming a metal-free area over the first side between the first antenna contact and the second antenna contact, wherein the metal-free area may extend between a first edge portion and a second edge portion of the carrier (in 830), and electrically connecting the first chip contact to the first antenna contact by a first chip connection, wherein the first chip connection may be at least partially arranged over the second side in a region opposite the metal-free area (in 840), arranging the chip card module over an antenna, such that windings of the antenna may extend along the metal-free area (in 1050), electrically conductively connecting a portion of a first end of the antenna to the first antenna contact (in 1060), and electrically conductively connecting a portion of a second end of the antenna to the second antenna contact (in 1070).

In various embodiments, a chip card module is provided. The chip card module may include a carrier having a first side and an opposite second side, a chip arranged over the carrier, the chip having a first chip contact, a first and a second antenna contact formed over the first side, a metal-free area formed over the first side between the first antenna contact and the second antenna contact, wherein the metal-free area may extend between a first edge portion and a second edge portion of the carrier, and a first chip connection electrically connecting the first chip contact to the first antenna contact, wherein the first chip connection is at least partially arranged over the second side in a region opposite the metal-free area.

In various embodiments, the first and the second antenna contacts may include through holes.

In various embodiments, the metal-free area may have a width of at least 1 mm.

In various embodiments, the chip may be arranged over the first side.

In various embodiments, a chip card module arrangement is provided. The chip card module arrangement may include a chip card module according to various embodiments and an antenna, wherein a portion of a first end of the antenna may be electrically conductively connected to the first antenna contact, a portion of a second end of the antenna may be electrically conductively connected to the second antenna contact, and windings of the antenna may be arranged to extend along the metal-free area.

In various embodiments, an outer surface of the antenna may be electrically conductive.

In various embodiments, the antenna may be arranged as a single layer.

In various embodiments, a chip card is provided. The chip card may include a chip card module arrangement according to various embodiments, and a card body, wherein the chip card module arrangement may be arranged over the card body.

In various embodiments, a method of forming a chip card module is provided. The method may include arranging a chip having a first chip contact over a carrier having a first side and an opposite second side, forming a first and a second antenna contact over the first side, forming a metal-free area over the first side between the first antenna contact and the second antenna contact, wherein the metal-free area may extend between a first edge portion and a second edge portion of the carrier, and electrically connecting the first chip contact to the first antenna contact by a first chip connection, wherein the first chip connection may be at least partially arranged over the second side in a region opposite the metal-free area.

In various embodiments, a method of forming a chip card is provided. The method may include the method of forming a chip card module according to various embodiments, arranging the chip card module and an antenna over a card body, such that windings of the antenna may extend along the metal-free area, electrically conductively connecting a portion of a first end of the antenna to the first antenna contact, and electrically conductively connecting a portion of a second end of the antenna to the second antenna contact.

In various embodiments, the arranging the antenna over the card body may include partially embedding the antenna in a layer of the card body while arranging the portion of the first end of the antenna and/or the portion of the second end of the antenna on a surface of the layer.

In various embodiments, the electrically conductively connecting the portion of the first end of the antenna to the first antenna contact and the electrically conductively connecting the portion of the second end of the antenna to the second antenna contact may include soldering.

In various embodiments, a method of forming a chip card arrangement is provided. The method may include the method of forming a chip card module according to various embodiments, arranging the chip card module over an antenna, such that windings of the antenna may extend along the metal-free area, electrically conductively connecting a portion of a first end of the antenna to the first antenna contact, and electrically conductively connecting a portion of a second end of the antenna to the second antenna contact.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

What is claimed is:

1. A chip card module, comprising:
   a carrier having a first side and an opposite second side;
   a chip arranged over the carrier, the chip having a first chip contact;

a first and a second antenna contact formed over the first side;
a metal-free area formed over the first side between the first antenna contact and the second antenna contact, wherein the metal-free area extends between a first edge portion and a second edge portion of the carrier; and
a first chip connection electrically connecting the first chip contact to the first antenna contact, wherein the first chip connection is at least partially arranged over the second side in a region opposite the metal-free area.

2. The chip card module according to claim 1, wherein the first and the second antenna contacts include through holes.

3. The chip card module according to claim 1, wherein the metal-free area has a width of at least 1 mm.

4. The chip card module according to claim 1, wherein the chip is arranged over the first side.

5. The chip card module according to claim 4, wherein the chip is located between the first and the second antenna contact.

6. A chip card module arrangement, comprising:
a chip card module, wherein the chip card module comprises,
a carrier having a first side and an opposite second side;
a chip arranged over the carrier, the chip having a first chip contact;
a first and a second antenna contact formed over the first side;
a metal-free area formed over the first side between the first antenna contact and the second antenna contact, wherein the metal-free area extends between a first edge portion and a second edge portion of the carrier; and
a first chip connection electrically connecting the first chip contact to the first antenna contact,
wherein the first chip connection is at least partially arranged over the second side in a region opposite the metal-free area; and
an antenna;
wherein a portion of a first end of the antenna is electrically conductively connected to the first antenna contact, a portion of a second end of the antenna is electrically conductively connected to the second antenna contact, and windings of the antenna are arranged to extend along the metal-free area.

7. The chip card module arrangement of claim 6, wherein an outer surface of the antenna is electrically conductive.

8. The chip card module arrangement of claim 6, wherein the antenna is arranged as a single layer.

9. The chip card module arrangement of claim 6, wherein the chip is arranged over the first side of the carrier between the first and the second antenna contact.

10. The chip card module arrangement of claim 9, wherein the antenna comprising a coil comprising a plurality of windings, and
wherein a first end of the antenna is located outside of the coil and is connected to the first antenna contact, and
wherein the second end of the antenna is located inside the coil and is connected to the second antenna contact.

11. A chip card, comprising:
a chip card module arrangement, comprising
a chip card module, wherein the chip card module comprises,
a carrier having a first side and an opposite second side;
a chip arranged over the carrier, the chip having a first chip contact;
a first and a second antenna contact formed over the first side;
a metal-free area formed over the first side between the first antenna contact and the second antenna contact, wherein the metal-free area extends between a first edge portion and a second edge portion of the carrier; and
a first chip connection electrically connecting the first chip contact to the first antenna contact,
wherein the first chip connection is at least partially arranged over the second side in a region opposite the metal-free area; and
an antenna;
wherein a portion of a first end of the antenna is electrically conductively connected to the first antenna contact, a portion of a second end of the antenna is electrically conductively connected to the second antenna contact, and windings of the antenna are arranged to extend along the metal-free area; and
a card body;
wherein the chip card module arrangement is arranged over the card body.

12. The chip card of claim 11, wherein the chip is arranged over the first side of the carrier between the first and the second antenna contact.

13. The chip card of claim 12, wherein the antenna comprising a coil comprising a plurality of windings, and
wherein a first end of the antenna is located outside of the coil and is connected to the first antenna contact, and
wherein the second end of the antenna is located inside the coil and is connected to the second antenna contact.

14. A method of forming a chip card module, the method comprising:
arranging a chip having a first chip contact over a carrier having a first side and an opposite second side;
forming a first and a second antenna contact over the first side;
forming a metal-free area over the first side between the first antenna contact and the second antenna contact, wherein the metal-free area extends between a first edge portion and a second edge portion of the carrier; and
electrically connecting the first chip contact to the first antenna contact by a first chip connection,
wherein the first chip connection is at least partially arranged over the second side in a region opposite the metal-free area.

15. The method of claim 14, wherein the chip is arranged over the first side of the carrier between the first and the second antenna contact.

16. A method of forming a chip card, comprising:
the method of forming a chip card module, the method comprising:
arranging a chip having a first chip contact over a carrier having a first side and an opposite second side;
forming a first and a second antenna contact over the first side;
forming a metal-free area over the first side between the first antenna contact and the second antenna contact, wherein the metal-free area extends between a first edge portion and a second edge portion of the carrier; and electrically connecting the first chip contact to the first antenna contact by a first chip connection,
wherein the first chip connection is at least partially arranged over the second side in a region opposite the metal-free area;
arranging the chip card module and an antenna over a card body, such that windings of the antenna extend along the metal-free area;
electrically conductively connecting a portion of a first end of the antenna to the first antenna contact; and
electrically conductively connecting a portion of a second end of the antenna to the second antenna contact.

17. The method of forming a chip card according to claim 16,
wherein the arranging the antenna over the card body comprises partially embedding the antenna in a layer of the card body while arranging the portion of the first end of the antenna and/or the portion of the second end of the antenna on a surface of the layer.

18. The method of forming a chip card according to claim 16,
wherein the electrically conductively connecting the portion of the first end of the antenna to the first antenna contact and the electrically conductively connecting the portion of the second end of the antenna to the second antenna contact comprises soldering.

19. The method of claim 16,
wherein the chip is arranged over the first side of the carrier between the first and the second antenna contact.

\* \* \* \* \*